US012381530B2

(12) United States Patent
Nomura

(10) Patent No.: US 12,381,530 B2
(45) Date of Patent: Aug. 5, 2025

(54) RESONATOR DEVICE

(71) Applicant: SEIKO EPSON CORPORATION, Tokyo (JP)

(72) Inventor: Norio Nomura, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 813 days.

(21) Appl. No.: 17/696,152

(22) Filed: Mar. 16, 2022

(65) Prior Publication Data
US 2022/0302894 A1 Sep. 22, 2022

(30) Foreign Application Priority Data
Mar. 22, 2021 (JP) ................................ 2021-046972

(51) Int. Cl.
*H03H 9/02* (2006.01)
*H03H 9/05* (2006.01)
*H03H 9/08* (2006.01)

(52) U.S. Cl.
CPC ...... *H03H 9/02102* (2013.01); *H03H 9/0538* (2013.01); *H03H 9/08* (2013.01)

(58) Field of Classification Search
CPC .... H03H 9/02102; H03H 9/0538; H03H 9/08; H03H 9/0547; H03H 9/1021; H03H 9/19; H03B 5/04; H03B 5/36
See application file for complete search history.

(56) References Cited

U.S. PATENT DOCUMENTS

| 7,514,852 B2 * | 4/2009 | Kasahara ............. H03H 9/0514 |
| | | 310/343 |
| 2014/0292151 A1 | 10/2014 | Kondo |
| 2016/0285461 A1 * | 9/2016 | Okubo ...................... H03L 1/00 |
| 2016/0285463 A1 * | 9/2016 | Owaki .................... H03L 1/022 |
| 2017/0040942 A1 * | 2/2017 | Isohata ..................... H03L 1/02 |
| 2017/0272081 A1 * | 9/2017 | Chiang ................. H01L 23/345 |
| 2018/0337634 A1 | 11/2018 | Kondo |

FOREIGN PATENT DOCUMENTS

| JP | 2006-279872 A | 10/2006 |
| JP | 2010-213280 A | 9/2010 |
| JP | 2011-174762 A | 9/2011 |
| JP | 2014-107604 A | 6/2014 |
| JP | 2014-192674 | 10/2014 |
| JP | 2015-033065 | 2/2015 |
| JP | 2017-028360 | 2/2017 |
| JP | 2017-130861 | 7/2017 |
| JP | 2017-130862 A | 7/2017 |
| JP | 2018-196105 A | 12/2018 |

* cited by examiner

*Primary Examiner* — Emily P Pham
(74) *Attorney, Agent, or Firm* — Rankin, Hill & Clark LLP

(57) ABSTRACT

A resonator device includes: a resonator element; a first package accommodating the resonator element; a heater bonded to the first package; and a second package accommodating the first package and the heater. The first package includes: a base substrate that has a first surface on which the resonator element is disposed and a second surface in a front-back relation with the first surface, and that contains single crystal silicon; an integrated circuit that is provided on the first surface or the second surface and that includes a temperature sensor; and a lid that is bonded to the base substrate such that the resonator element is accommodated between the lid and the base substrate.

7 Claims, 7 Drawing Sheets

RESONATOR DEVICE

The present application is based on, and claims priority from JP Application Serial Number 2021-046972, filed Mar. 22, 2021, the disclosure of which is hereby incorporated by reference herein in its entirety.

BACKGROUND

1. Technical Field

The present disclosure relates to a resonator device.

2. Related Art

In the related art, as an example of a resonator device, there is known an oscillator in which a temperature of a resonator element or the like is stabilized by heating the resonator element or the like, and a resonance frequency is stabilized. For example, JP-A-2017-28360 discloses an oven controlled crystal oscillator (OCXO) in which a resonator element, a heat generating element, and a circuit element serving as an oscillation unit are accommodated in a package made of ceramic or the like, and a stable oscillation frequency is output.

However, in the resonator device described in JP-A-2017-28360, since one end of the resonator element is coupled to the heat generating element, it is difficult for heat of the heat generating element to be uniformly transferred to the entire resonator element, a temperature difference is generated in the resonator element, and accuracy of the oscillation frequency deteriorates.

SUMMARY

A resonator device includes: a resonator element; a first package accommodating the resonator element; a heater bonded to the first package; and a second package accommodating the first package and the heater. The first package includes: a base substrate that has a first surface on which the resonator element is disposed and a second surface in a front-back relation with the first surface, and that contains single crystal silicon; an integrated circuit that is provided on the first surface or the second surface and that includes a temperature sensor; and a lid that is bonded to the base substrate such that the resonator element is accommodated between the lid and the base substrate.

DESCRIPTION OF EXEMPLARY EMBODIMENTS

1. First Embodiment

First, a resonator device 1 according to a first embodiment will be described with reference to FIGS. 1 and 2.

Figure 1:
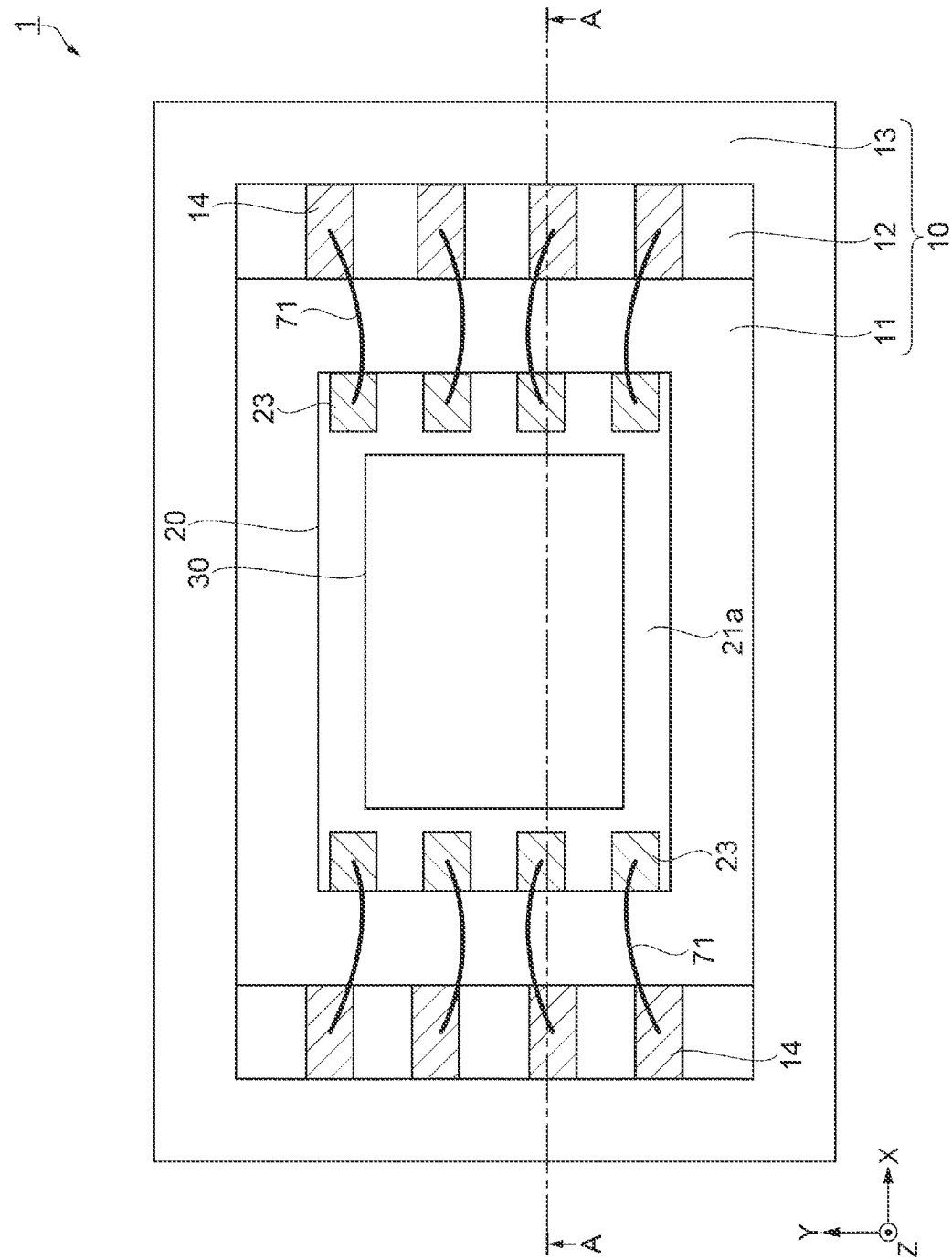
FIG. 1 is a plan view showing a schematic structure of a resonator device according to a first embodiment.

FIG. 1 shows a state in which a lid 16 is removed for convenience of description of an internal configuration of the resonator device 1. For convenience of description, in each of the following drawings except for FIG. 4, an X axis, a Y axis, and a Z axis are shown as three axes orthogonal to one another. A direction along the X axis is referred to as an "X direction", a direction along the Y axis is referred to as a "Y direction", and a direction along the Z axis is referred to as a "Z direction". An arrow side of each axis is also referred to as a "plus side", and a side opposite to the arrow is also referred to as a "minus side". A plus side in the Z direction is also referred to as "upper", and a minus side in the Z direction is also referred to as "lower".

Figure 2:
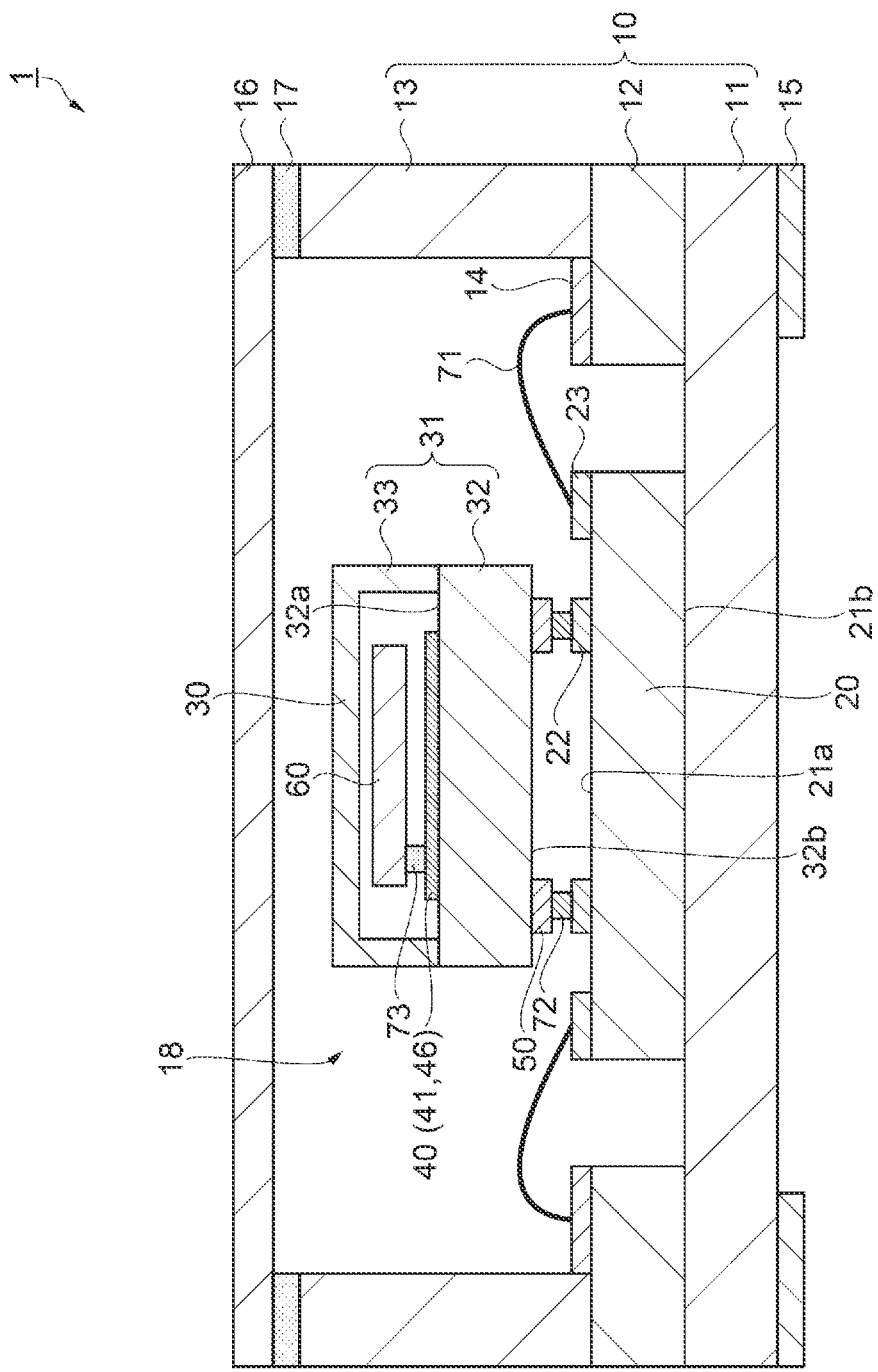
FIG. 2 is a cross-sectional view taken along a line A-A in FIG. 1.

As shown in FIGS. 1 and 2, the resonator device 1 includes: an oscillator 30 including a first package 31 that accommodates a resonator element 60; a heater 20 that is bonded to the first package 31; a second package 10 that accommodates the first package 31 of the oscillator 30 and the heater 20; and the lid 16 that defines, together with the second package 10, an internal space 18. Therefore, the resonator device 1 of the present embodiment corresponds to an oven controlled crystal oscillator (OCXO) in which the second package 10 is used as a thermostatic oven.

The first package 31 includes a base substrate 32 and a lid 33, and accommodates the resonator element 60 between the base substrate 32 and the lid 33.

The base substrate 32 has a first surface 32a on which the resonator element 60 is disposed and a second surface 32b in a front-back relation with the first surface 32a. An integrated circuit 40 including an oscillation circuit 41, a temperature sensor 46, and the like is provided on the first surface 32a, and the resonator element 60 is fixed to the integrated circuit 40 via a conductive member 73 such as a metal bump. Therefore, since a distance between the resonator element 60 and the temperature sensor 46 is short, a temperature of the resonator element 60 can be detected with higher accuracy. External coupling terminals 50 for bonding the first package 31 to the heater 20 are formed at the second surface 32b of the base substrate 32.

A constituent material of the first package 31 is a semiconductor material, for example, silicon containing single crystal silicon.

The heater 20 is used to keep the first package 31, in which the resonator element 60 is accommodated, at a constant temperature. The heater 20 includes a bonding surface 21a for bonding the first package 31. The first package 31 is bonded to the bonding surface 21a, and a surface 21b opposite from the bonding surface 21a is fixed to the second package 10.

The second package 10 is formed by stacking a flat plate-shaped first substrate 11, a frame-shaped second substrate 12, and a frame-shaped third substrate 13 having an internal dimension larger than that of the second substrate 12. The second package 10 includes the internal space 18 that opens upward.

The first package 31 and the heater 20 are accommodated in the internal space 18. The surface 21b opposite from the bonding surface 21a of the heater 20 is fixed on the first substrate 11 via a bonding member (not shown), and the first package 31 is fixed, via a conductive member 72 such as a metal bump, on the bonding surface 21a which serves as an upper surface of the heater 20. The state in which the first package 31 is fixed to the heater 20 means that first coupling terminals 22 formed on the bonding surface 21a of the heater 20, to which the first package 31 is bonded, and the external coupling terminals 50 formed on the second surface 32b of the base substrate 32, which constitutes the first package 31, are respectively mechanically and electrically bonded via the conductive member 72.

In the internal space 18, internal terminals 14 formed on the second substrate 12 of the second package 10 and second coupling terminals 23 formed on the bonding surface 21a of the heater 20 are respectively electrically coupled to each other via conductive wires 71 such as metal bonding wires. The first coupling terminals 22 and the second coupling terminals 23 formed on the bonding surface 21a of the heater 20 are respectively electrically coupled via wirings (not shown).

External terminals 15 are formed on a lower surface of the second package 10. The external terminals 15 are respectively electrically coupled, via through electrodes or interlayer wirings (not shown), to the internal terminals 14 formed on the second substrate 12.

Examples of a constituent material of the second package 10 include various kinds of ceramics such as oxide-based ceramics, nitride-based ceramics, and carbide-based ceramics having thermal conductivity lower than thermal conductivity of the first package 31. Therefore, since the thermal conductivity of the first package 31 is higher than the thermal conductivity of the second package 10, heat of the heater 20 is more easily transferred to the first package 31, and the first package 31 can be efficiently heated. An influence of a temperature variation outside the second package 10 can be effectively reduced.

The lid 16 has a flat plate shape and is bonded to an upper surface of the second package 10 via a bonding member 17. As a result, the internal space 18 is formed air-tightly between the second package 10 and the lid 16, and the first package 31 and the heater 20 are accommodated in the internal space 18. The internal space 18 is in a depressurized state, preferably in a state closer to vacuum. As a result, convective heat transfer from the first package 31 and the heater 20 to the second package 10 can be reduced, and the internal space 18 can be maintained at a more constant temperature.

Figure 3:
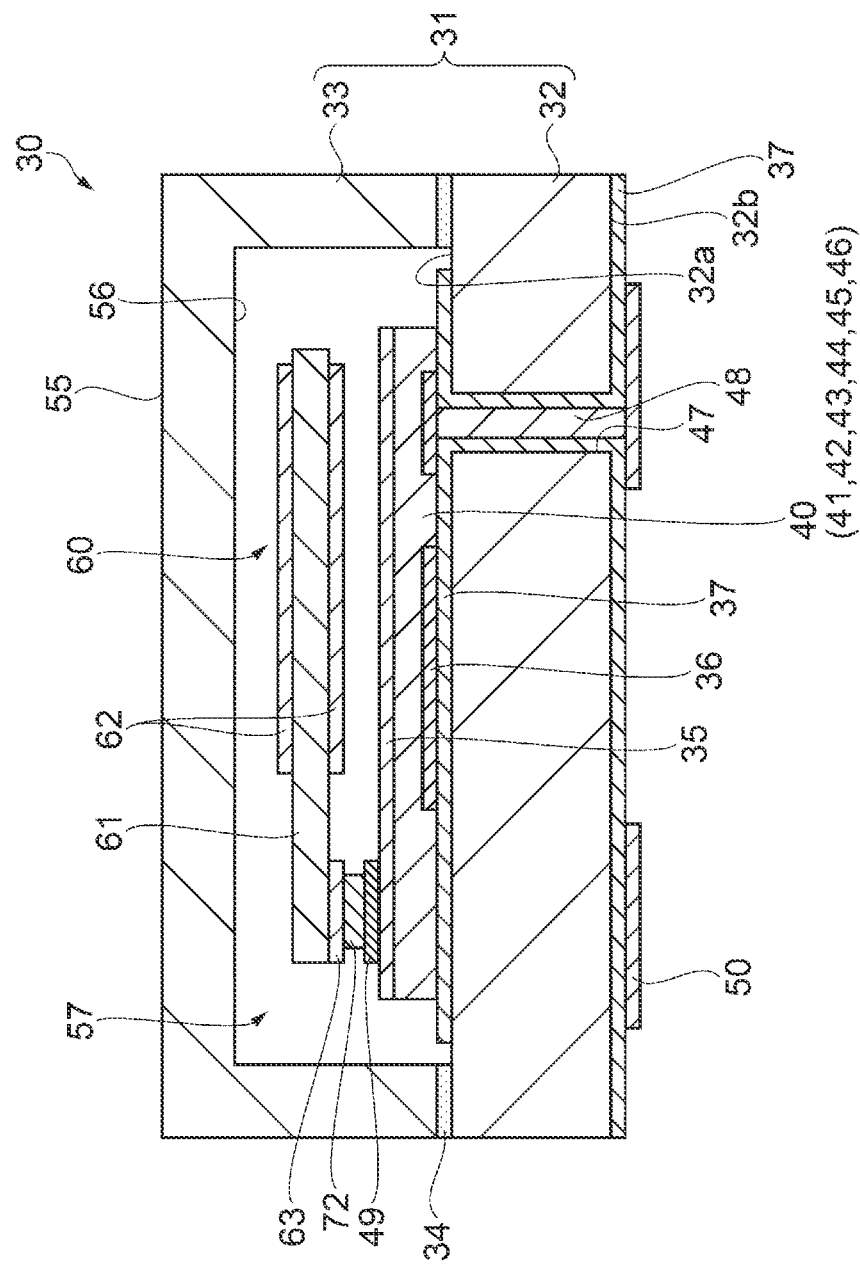
FIG. 3 is a cross-sectional view showing a schematic structure of an oscillator.

Next, a configuration of the oscillator 30 will be described with reference to FIG. 3.

The oscillator 30 of the present embodiment is used as, for example, a temperature compensated crystal oscillator (TCXO). As shown in FIG. 3, the oscillator 30 includes the first package 31 including the base substrate 32 and the lid 33, and the resonator element 60 accommodated in an internal space 57 of the first package 31.

The first package 31 includes the base substrate 32 and the lid 33 bonded to the base substrate 32, and the resonator element 60 is accommodated in the internal space 57 formed between the base substrate 32 and the lid 33.

The base substrate 32 is a semiconductor substrate containing single crystal silicon, particularly, a silicon substrate in the present embodiment. The base substrate 32 is not particularly limited, and a semiconductor substrate other than a silicon substrate, for example, a semiconductor substrate such as a germanium substrate, a gallium arsenide substrate, a gallium phosphide substrate, a gallium nitride substrate, or a silicon carbide substrate may be used, or a substrate such as a ceramic substrate other than a semiconductor substrate may be used.

The base substrate 32 has a plate shape, and has the first surface 32a on which the resonator element 60 is disposed and the second surface 32b in a front-back relation with the first surface 32a. An insulating film 37 is formed on a surface of the base substrate 32. A wiring 36 is formed on the first surface 32a of the base substrate 32. The wiring 36 electrically couples functional elements such as the integrated circuit 40 electrically coupled to the resonator element 60, the oscillation circuit 41 formed in the integrated circuit 40, and the temperature sensor 46. However, the integrated circuit 40 and the wiring 36 may be formed on the second surface 32b instead of the first surface 32a of the base substrate 32.

A passivation film 35 is formed on the integrated circuit 40, and an internal coupling terminal 49 is formed on the passivation film 35. The internal coupling terminal 49 is electrically coupled to the wiring 36 and bonds the resonator element 60. The external coupling terminals 50 for outputting a frequency signal or the like output from the integrated circuit 40 to the outside are formed on the insulating film 37 formed on the second surface 32b of the base substrate 32. The base substrate 32 includes a through hole 47 penetrating the base substrate 32 in the Z direction which is a thickness direction, and the through hole 47 is filled with a conductive material to form a through electrode 48. Therefore, the wiring 36 formed on the first surface 32a of the base substrate 32 and the external coupling terminals 50 formed on the second surface 32b of the base substrate 32 can be electrically coupled via the through electrode 48.

The resonator element 60 accommodated in the internal space 57 includes a quartz crystal substrate 61, an excitation electrode 62 that vibrates the quartz crystal substrate 61, a coupling terminal 63 that outputs a resonator signal to the outside and fixes the resonator element 60 to the first package 31, and a lead electrode (not shown) that electrically couples the excitation electrode 62 and the coupling terminal 63.

The resonator element 60 is disposed and fixed on the first surface 32a of the first package 31 via the conductive member 72 such as a metal bump. The state in which the resonator element 60 is fixed to the first package 31 means that the internal coupling terminal 49 formed on the base substrate 32 of the first package 31 and the coupling terminal 63 formed on the quartz crystal substrate 61 of the resonator element 60 are mechanically and electrically bonded to each other via the conductive member 72. As the quartz crystal substrate 61, an AT-cut quartz crystal substrate, an SC-cut quartz crystal substrate, a BT-cut quartz crystal substrate, or the like is used.

Similarly to the base substrate 32, the lid 33 is a silicon substrate. As a result, linear expansion coefficients of the base substrate 32 and the lid 33 are equal, generation of thermal stress due to thermal expansion is prevented, and the oscillator 30 having high resonator characteristics is obtained. In addition, since the oscillator 30 can be formed by a semiconductor process, the oscillator 30 can be manufactured with high accuracy, and a size of the oscillator 30 can be reduced. The lid 33 is not particularly limited, and a semiconductor substrate other than a silicon substrate, for example, a semiconductor substrate such as a germanium substrate, a gallium arsenide substrate, a gallium phosphide substrate, a gallium nitride substrate, or a silicon carbide substrate may be used. For example, a substrate other than a semiconductor substrate such as a metal substrate such as Kovar, or a glass substrate may be used.

The lid 33 includes a bottomed recess 56 that opens on a side opposite from an outer surface 55, which is an upper surface of the lid 33, and that accommodates the resonator element 60 therein. A lower surface of the lid 33 is bonded to the first surface 32a of the base substrate 32 via a bonding member 34. As a result, the lid 33 forms, together with the base substrate 32, the internal space 57 for accommodating the resonator element 60. As a bonding method of the base substrate 32 and the lid 33, a bonding method such as diffusion bonding using diffusion of metals contained in the base substrate 32 and the lid 33 instead of using the bonding member 34 may be used.

In addition, the internal space 57 is airtight and is in a depressurized state, preferably in a state closer to vacuum. As a result, viscous resistance is reduced, and oscillation characteristics of the resonator element 60 are improved. However, an atmosphere of the internal space 57 is not particularly limited, and may be, for example, an atmosphere in which an inert gas such as nitrogen or argon is sealed, or may be an atmospheric pressure state or a pressurized state instead of a depressurized state.

Next, a configuration of the integrated circuit 40 will be described with reference to FIG. 4.

Figure 4:
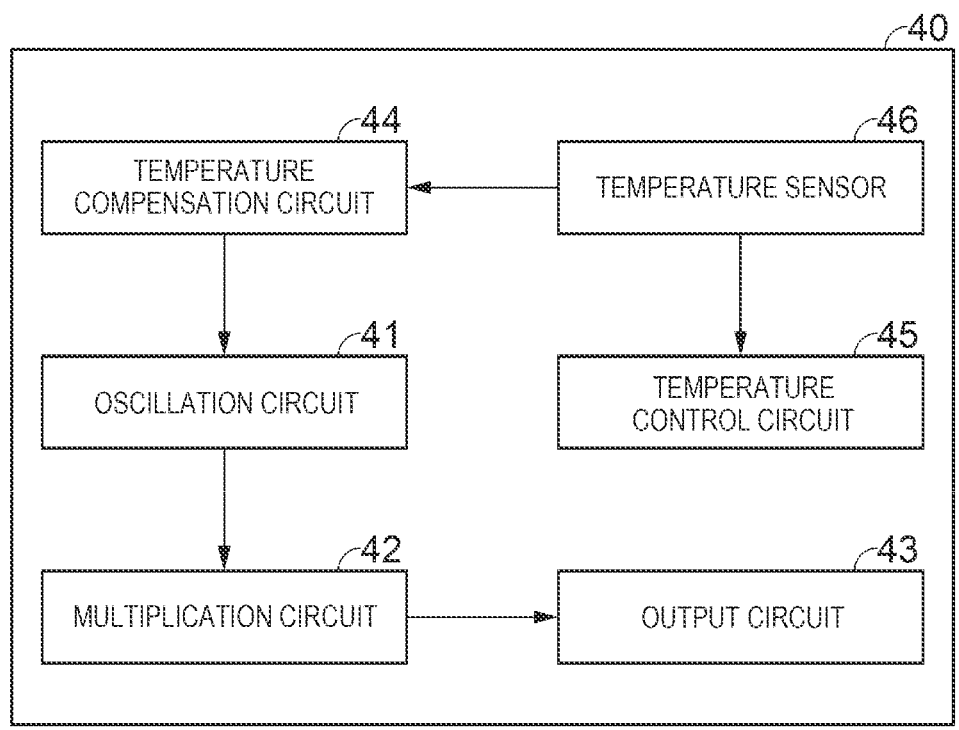
FIG. 4 is a functional block diagram of an integrated circuit.

As shown in FIG. 4, the integrated circuit 40 of the present embodiment includes the oscillation circuit 41, a multiplication circuit 42, an output circuit 43, a temperature compensation circuit 44, a temperature control circuit 45, and the temperature sensor 46.

The oscillation circuit 41 is electrically coupled to the resonator element 60, amplifies an output signal of the resonator element 60, and feeds back the amplified signal to the resonator element 60, and thereby the resonator element 60 oscillates. The multiplication circuit 42 multiplies a frequency signal output from the oscillation circuit 41. The output circuit 43 outputs the multiplied frequency signal from the external coupling terminal 50 to the outside.

The temperature compensation circuit 44 performs temperature compensation based on temperature information output from the temperature sensor 46 such that frequency variation of an oscillation signal of the oscillation circuit 41 is smaller than that of frequency-temperature characteristics of the resonator element 60. As a result, high temperature characteristics can be exhibited. The temperature compensation circuit 44 may, for example, adjust an oscillation frequency of the oscillation circuit 41 by adjusting a capacitance of a variable capacitance circuit coupled to the oscillation circuit 41, or may adjust a frequency of an output signal of the oscillation circuit 41 by a Phase Locked Loop (PLL) circuit or a direct digital synthesizer circuit.

The temperature control circuit 45 is a circuit for maintaining the resonator element 60 at a constant temperature by controlling an amount of current flowing through the heater 20 based on the temperature information output from the temperature sensor 46. For example, when a current temperature determined based on an output signal of the temperature sensor 46 is lower than a set reference temperature, the temperature control circuit 45 performs control such that a desired current flows through the heater 20, and when the current temperature is higher than the reference temperature, the temperature control circuit 45 performs control such that the current does not flow through the heater 20.

Further, for example, the temperature control circuit 45 may perform control to increase or decrease the amount of current flowing through the heater 20 according to a difference between the current temperature and the reference temperature. The temperature sensor 46 serves as both a temperature sensor for the temperature compensation circuit 44 and a temperature sensor for the temperature control circuit 45. Therefore, the number of components can be reduced, and the size of the oscillator 30 can be reduced. However, the present embodiment is not limited thereto, and the temperature sensor for the temperature compensation circuit 44 and the temperature sensor for the temperature control circuit 45 may be provided separately.

The temperature sensor 46 is an element that detects a temperature, and can be formed by providing a Si diode or a PNP transistor in the integrated circuit 40.

As described above, in the resonator device 1 of the present embodiment, since the resonator element 60 is accommodated in the first package 31 bonded to the heater 20 and having high thermal conductivity, the heat of the heater 20 is transferred to the resonator element 60 by heat radiation from the entire first package 31, so that temperature unevenness in the resonator element 60 can be prevented. In addition, since the temperature sensor 46 is provided in the first package 31, a temperature difference between the resonator element 60 and the temperature sensor 46 can be prevented, temperature control can be performed with high accuracy, and accuracy of an oscillation frequency output from the resonator device 1 can be improved.

Since the conductive member 72 such as a metal bump is used for electrically coupling the first package 31 and the heater 20, a size of the resonator device 1 can be reduced as compared with a case in which a bonding wire is used.

2. Second Embodiment

Next, a resonator device 1a according to a second embodiment will be described with reference to FIG. 5.

The resonator device 1a of the present embodiment is the same as the resonator device 1 of the first embodiment except that a position of the first package 31 bonded to a heater 20a is different from that of the resonator device 1 of the first embodiment. Differences from the first embodiment described above will be mainly described, the same elements will be denoted by the same reference numerals, and description thereof will be omitted.

Figure 5:
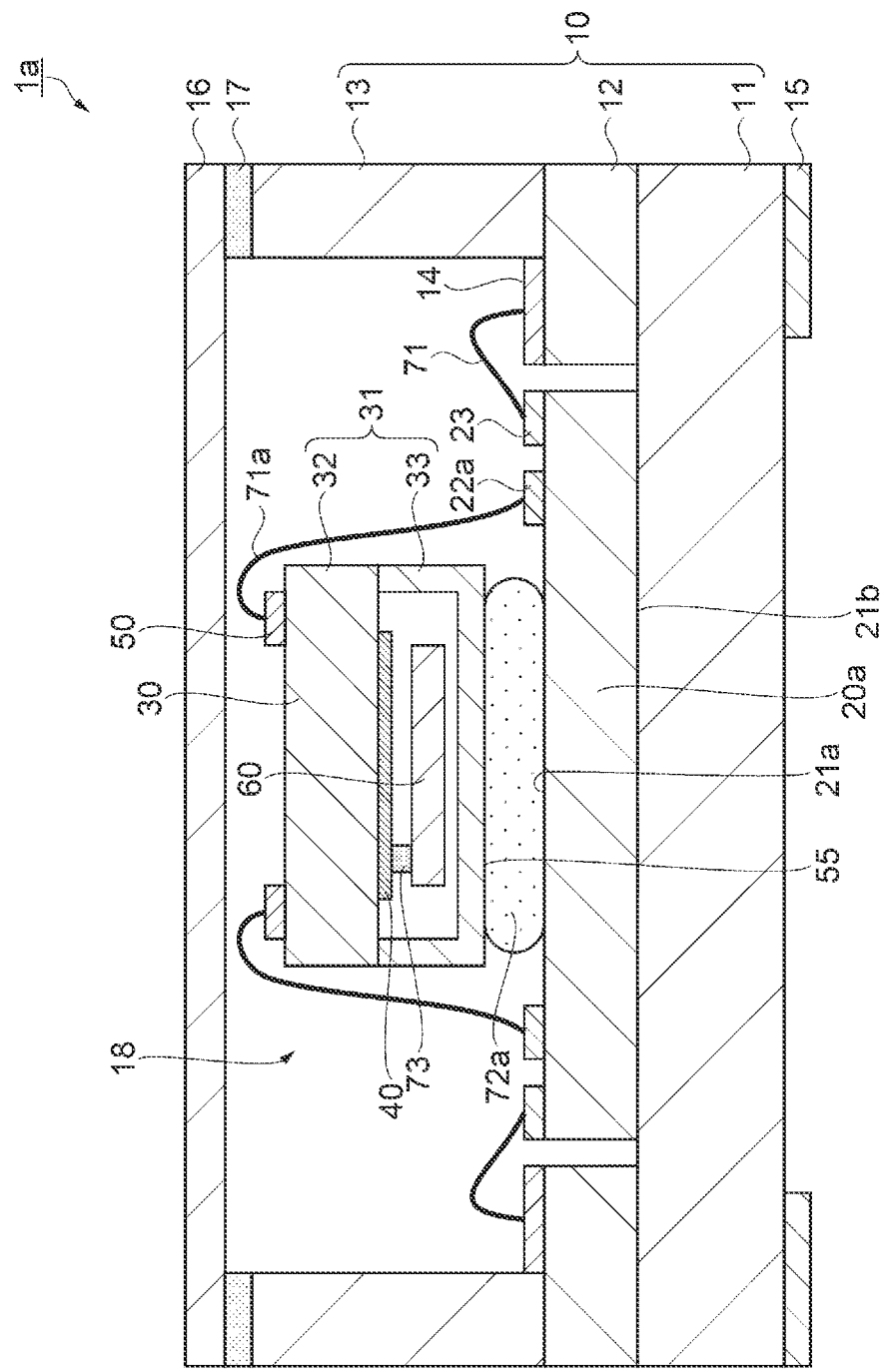
FIG. 5 is a cross-sectional view showing a schematic structure of a resonator device according to a second embodiment.

As shown in FIG. 5, in the resonator device 1a, the outer surface 55 of the lid 33 of the first package 31 and a bonding surface 21a of the heater 20a are mechanically coupled to each other via a bonding member 72a. That is, the first package 31 is fixed to the bonding surface 21a in a vertically reversed manner as compared with that of the resonator device 1 of the first embodiment. The external coupling terminals 50 formed on the second surface 32b of the first package 31 and first coupling terminals 22a formed on the bonding surface 21a of the heater 20a are respectively electrically coupled via conductive wires 71a.

According to such a configuration, since a bonding area between the first package 31 and the heater 20a can be increased, the thermal conductivity from the heater 20a to the first package 31 can be increased, and the same effects as those of the resonator device 1 of the first embodiment can be obtained.

3. Third Embodiment

Next, a resonator device 1b according to a third embodiment will be described with reference to FIG. 6.

The resonator device 1b of the present embodiment is the same as the resonator device 1 of the first embodiment except that a heat insulating member 80 is provided between the heater 20 and the first substrate 11 of the second package 10, as compared with the resonator device 1 of the first embodiment. Differences from the first embodiment described above will be mainly described, the same elements will be denoted by the same reference numerals, and description thereof will be omitted.

Figure 6:
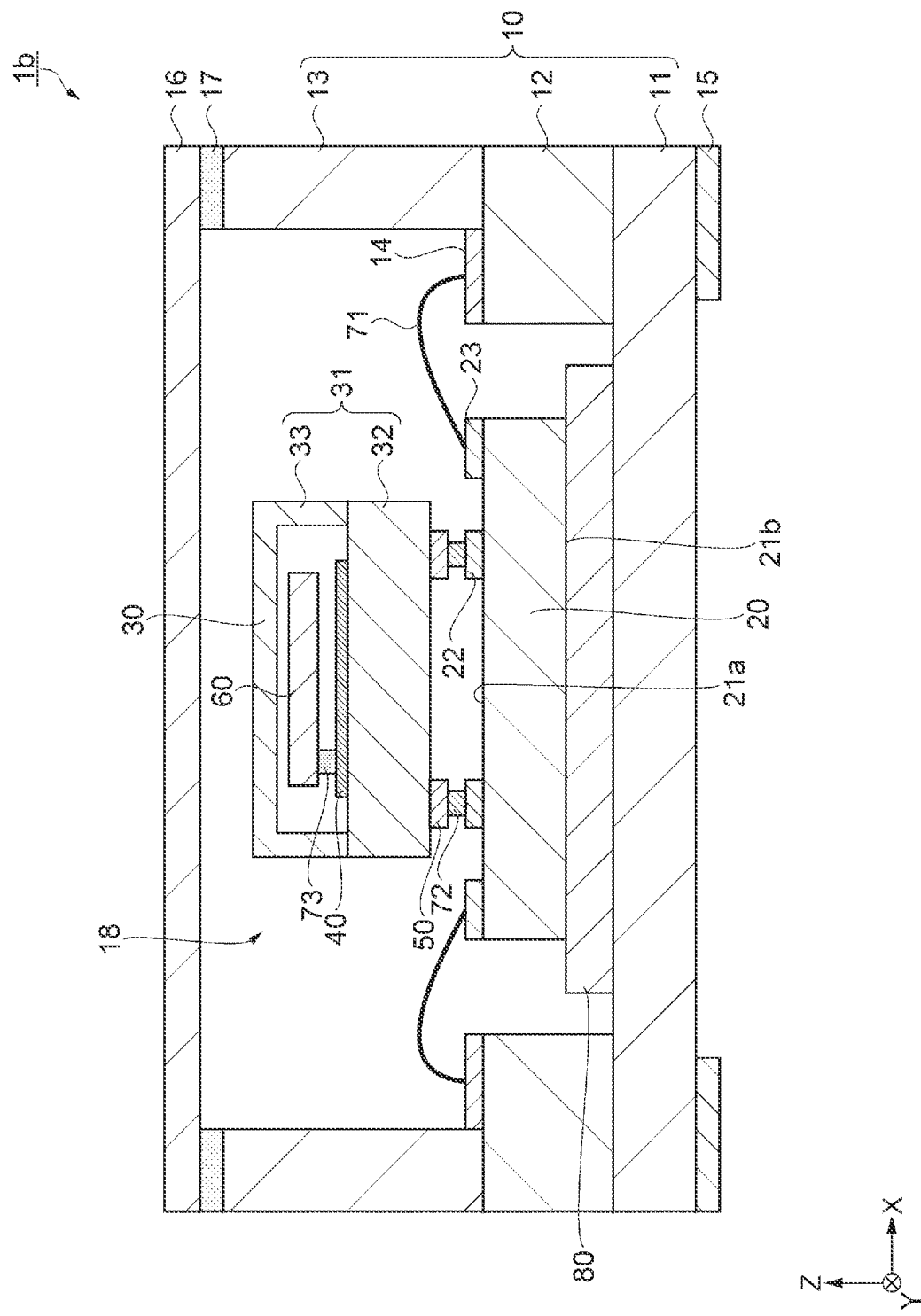
FIG. 6 is a cross-sectional view showing a schematic structure of a resonator device according to a third embodiment.

As shown in FIG. 6, in the resonator device 1b, the heat insulating member 80 is provided between the heater 20 and the first substrate 11 of the second package 10. The heat insulating member 80 is fixed to the first substrate 11 via a bonding member (not shown). Further, the heater 20 is fixed on the heat insulating member 80 via a bonding member (not shown).

The heat insulating member 80 is made of a material having thermal conductivity lower than that of the second package 10. The heat insulating member 80 is not particularly limited. For example, various resin materials, particularly, porous resin materials such as porous polyimide can be suitably used. In addition to the resin materials, various glass materials, inorganic porous materials such as silica aerogel, and the like can be used. The thermal conductivity of the heat insulating member 80 is not particularly limited, and is preferably 1.0 W/m·K or less. As a result, the heat insulating member 80 having a sufficiently low thermal conductivity is obtained.

The heat insulating member 80 may include a gap material having sufficiently low thermal conductivity, such as silica gel. Therefore, a thickness of the heat insulating member 80 can be controlled, and a heat insulating effect can be more reliably exhibited.

According to such a configuration, the heat of the heater 20 can be sufficiently prevented from being transferred to the second package 10, and the same effects as those of the resonator device 1 of the first embodiment can be obtained.

4. Fourth Embodiment

Next, a resonator device 1c according to a fourth embodiment will be described with reference to FIG. 7.

The resonator device 1c of the present embodiment is the same as the resonator device 1 of the first embodiment except that a method of mounting the heater 20 to a second package 10c is different from that of the resonator device 1 of the first embodiment. Differences from the first embodiment described above will be mainly described, the same elements will be denoted by the same reference numerals, and description thereof will be omitted.

Figure 7:
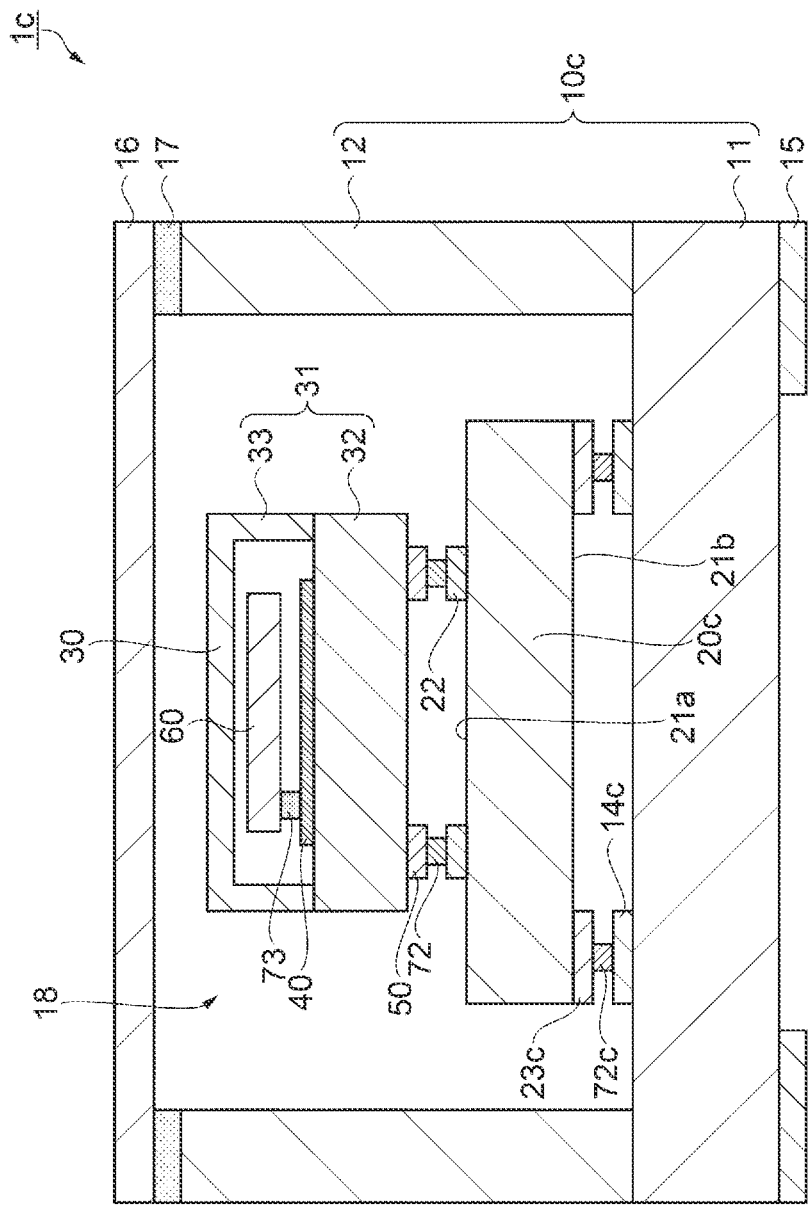
FIG. 7 is a cross-sectional view showing a schematic structure of a resonator device according to a fourth embodiment.

As shown in FIG. 7, in the resonator device 1c, a heater 20c is fixed to the second package 10c via conductive members 72c such as metal bumps. More specifically, second coupling terminals 23c formed on the surface 21b opposite from the bonding surface 21a of the heater 20c and third coupling terminals 14c formed on the first substrate 11 of the second package 10c are respectively mechanically and electrically coupled via the conductive members 72c.

According to such a configuration, since wire bonding is not used for electrically coupling the heater 20c and the second package 10c, a size of the resonator device 1c can be reduced, and the same effects as those of the resonator device 1 of the first embodiment can be obtained.

What is claimed is:

1. A resonator device, comprising:
   a resonator element;
   a first package accommodating the resonator element;
   a heater bonded to the first package; and
   a second package accommodating the first package and the heater, wherein
   the first package includes:
      a base substrate that has a first surface on which the resonator element is disposed and a second surface in a front-back relation with the first surface, and that contains single crystal silicon;
      an integrated circuit that is provided on the first surface or the second surface and that includes a temperature sensor; and
      a lid that is bonded to the base substrate such that the resonator element is accommodated between the lid and the base substrate.

2. The resonator device according to claim 1, wherein the integrated circuit is provided on the first surface.

3. The resonator device according to claim 1, wherein the heater is fixed to the second package, and
thermal conductivity of the first package is higher than thermal conductivity of the second package.

4. The resonator device according to claim 1, wherein the first package further includes an external coupling terminal on the second surface,
the heater includes a first coupling terminal on a bonding surface to which the first package is bonded, and
the external coupling terminal and the first coupling terminal are mechanically and electrically bonded to each other via a conductive member.

5. The resonator device according to claim 1, wherein the first package further includes an external coupling terminal on the second surface,
the heater includes a first coupling terminal on a bonding surface to which the first package is bonded,
the external coupling terminal and the first coupling terminal are electrically coupled to each other via a conductive wire, and
an outer surface of the lid and the bonding surface of the heater are mechanically coupled to each other via a bonding member.

6. The resonator device according to claim 4, wherein the heater further includes a second coupling terminal on a surface thereof opposite from the bonding surface,
the second package includes a third coupling terminal, and
the second coupling terminal and the third coupling terminal are mechanically and electrically coupled to each other via a conductive member.

7. The resonator device according to claim 1, wherein the heater is fixed to the second package via a heat insulating member.

* * * * *